(12) United States Patent
Kuwabara (10) Patent No.: US 6,900,434 B2
(45) Date of Patent: May 31, 2005

(54) METHOD AND DEVICE FOR SEPARATING ION MASS, AND ION DOPING DEVICE

(75) Inventor: Hajime Kuwabara, Chiba (JP)

(73) Assignee: Ishikawajima-Harima Jukogyo Kabushiki Kaisha, Tokyo (JP)

( * ) Notice: Subject to any disclaimer, the term of this patent is extended or adjusted under 35 U.S.C. 154(b) by 51 days.

(21) Appl. No.: 10/204,412

(22) PCT Filed: Dec. 27, 2001

(86) PCT No.: PCT/JP01/11556
§ 371 (c)(1),
(2), (4) Date: Jan. 29, 2004

(87) PCT Pub. No.: WO02/054441
PCT Pub. Date: Jul. 11, 2002

(65) Prior Publication Data
US 2004/0113069 A1 Jun. 17, 2004

(30) Foreign Application Priority Data
Dec. 28, 2000 (JP) ........................... 2000-401014

(51) Int. Cl.⁷ ............................. H01J 49/30
(52) U.S. Cl. .................. 250/298; 250/299; 250/300
(58) Field of Search ................. 250/298, 299, 250/300, 281

(56) References Cited

U.S. PATENT DOCUMENTS

| | | | |
|---|---|---|---|
| 3,842,269 A | * 10/1974 | Liebl et al. | ............ 250/298 |
| 5,043,576 A | * 8/1991 | Broadhurst et al. | ......... 250/281 |
| 5,350,926 A | 9/1994 | White et al. | |
| 5,834,786 A | 11/1998 | White et al. | |
| 6,160,262 A | 12/2000 | Aoki et al. | |

FOREIGN PATENT DOCUMENTS

| | | |
|---|---|---|
| JP | 10-241590 | 9/1998 |
| JP | 10-283977 | 10/1998 |

* cited by examiner

*Primary Examiner*—John P. Lee
*Assistant Examiner*—Erin-Michael Gill
(74) *Attorney, Agent, or Firm*—Oblon, Spivak, McClelland, Maier & Neustadt, P.C.

(57) ABSTRACT

A hollow exciting current pathway in the form of a conductor is arranged outside of an ion deflection casing with a curved contour and having an inlet and an outlet. The conductor is composed of a widthwise spiral formation of conductors running through the inlet and outlet and along the curved contour with a result that a magnetic field which is uniform widthwise is formed in the ion deflection casing. An ion beam is introduced through between the conductors at the inlet into the hollow exciting current pathway. By the action of the magnetic field through the hollow exciting current pathway, the ion beam is bent depending upon mass of ions. The ion beam with desired mass is taken out through between the conductors at the outlet with a result that an ion beam greater in size can be ion mass separated uniformly.

12 Claims, 7 Drawing Sheets

METHOD AND DEVICE FOR SEPARATING ION MASS, AND ION DOPING DEVICE

TECHNICAL FIELD

The present invention relates to an ion mass separation process, an ion mass separator and an ion doping apparatus, enabling stable mass separation in an ion beam larger in size and particularly broader in width.

BACKGROUND ART

Ion doping or implanting apparatuses have been used for adding electroactive elements to a semiconductor or adding atoms of an additive to a substrate for adhesive joining of hardly adhesive material to the substrate.

Up to the present, however, there have been no ion mass separating, ion doping apparatus using an ion beam larger in size (for example, 300 mm×800 mm). Conventionally employed in ion doping apparatuses is a non-mass-separation system using an ion beam for ion doping without ion mass separation or a magnetic filter system using a magnetic filter for simple reduction in ratio of lighter ion species (for example, hydrogen ions) in a plasma generating portion of an ion generator.

For example, in an ion doping apparatus for a semiconductor, hydrogen-diluted phosphine ($PH_3$) or diborane ($B_2H_6$) is used as plasma-generating source gas for an ion generator, which generates not only desired $PH_x$ and $B_2H_x$ but also ion species such as $H_x$, $P_2H_x$ and $BH_x$ in the plasma generating portion, a mixed beam of such ion species being extracted from the plasma generating portion. Such existence of the ion species other than the desired ones will lead to a problem of nonuniformity in implantation depth distribution of P and B through ion doping as well as a problem of imparting extra thermal load to a substrate.

Accordingly, it has been desired to promptly establish technique for stable mass separation in an ion beam larger in size and particularly broader in width.

Figure 1:
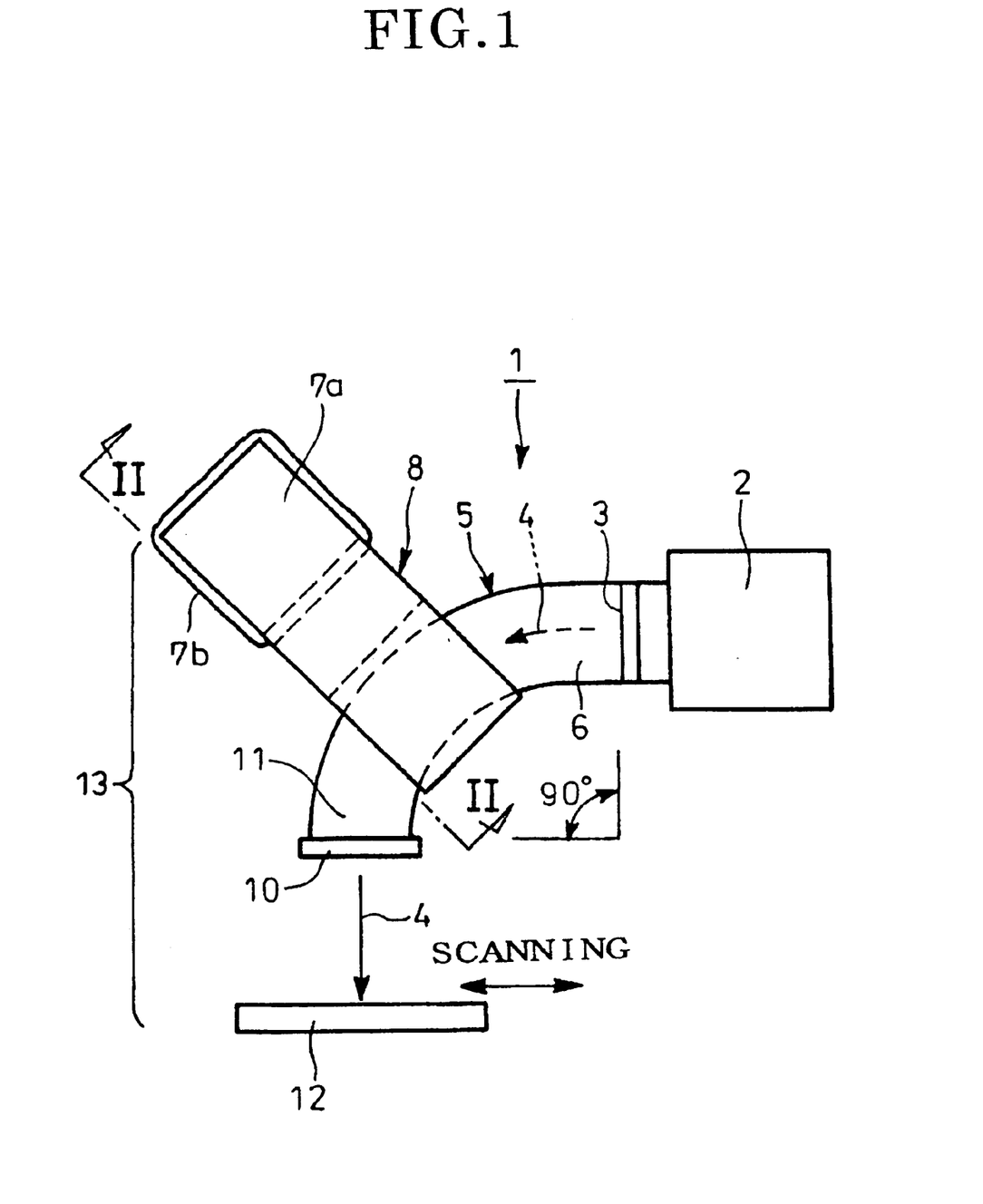
FIG. 1 is a schematic side view of a conventional ion mass separator and ion doping apparatus.
Figure 2:
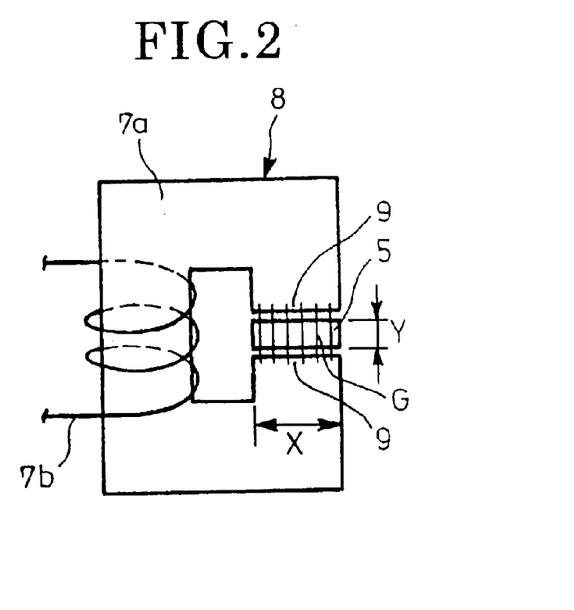
FIG. 2 is a view looking in the direction of arrows II in FIG. 1.

Meanwhile, there have been envisaged ion mass separators for ion beams smaller in size. FIGS. 1 and 2 show an example of an ion mass separator for an ion beam smaller in size. In this ion mass separator 1, ions generated in a plasma generating portion (not shown) are extracted and accelerated by ion extraction electrodes 3 into an ion beam 4 which is guided to a small-sized, vacuum ion deflection pathway 5 via an inlet 6 at one end thereof. Arranged outside of an intermediate portion of the ion deflection pathway 5 is an electro-magnet 8 comprising an iron core 7a with a solenoid 7b wound thereon. As shown in FIG. 2, magnetism generating portions 9 of the electro-magnet 8 are adjacent to the ion deflection pathway 5. Ions (charged particles) in the ion beam 4 move through the ion deflection pathway 5 to receive bending action in directions perpendicular to directions of magnetic field lines G in a magnetic field of the electro-magnet 8 with a result that the ion beam 4 is bent in the ion deflection pathway 5. In this respect, generating a strong magnetic field can cause the ion beam 4 to be bent with a greater deflection angle (90° in FIG. 1) with a result that ions with mass less than that desired are bent earlier and collide with a smaller-radius side inner peripheral portion of the ion deflection pathway 5 for separation whereas ions with mass greater than that desired fail to be fully bent and collide with a larger-radius side inner peripheral portion of the ion deflection pathway 5 for separation. This enables only targeted ions to be accelerated by ion acceleration electrodes 10 at the other end of the ion deflection pathway 5 and to be taken out through an outlet 11.

The take-out ion beam 4 from the ion mass separator 1 is used in an ion doping apparatus where operations such as convergence of the ion beam 4 may be effected as needs demand and then irradiation to a substrate 12 to be dealt with is effected to implant the ions into the substrate 12. In the ion doping apparatus 13, ion doping is effected over an extensive surface of the substrate 12 through movement of the substrate 12 or electrical scanning of the ion beam 4.

Figure 3:
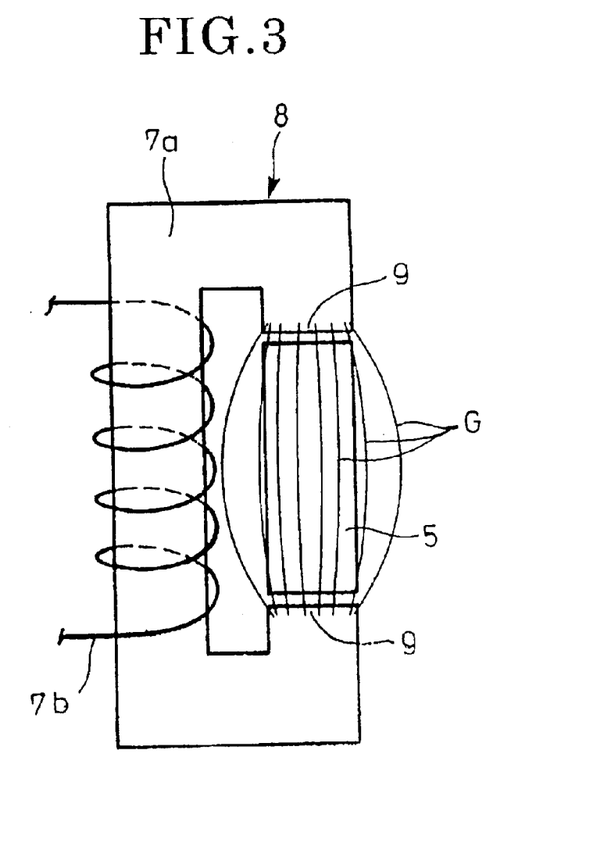
FIG. 3 is an explanatory view showing a state of spacing being increased between magnetism generating portions of an electromagnet shown in FIG. 2.

However, in the above-mentioned ion mass separator 1 using the electromagnet 8 having the iron core 7a with the solenoid 7b wound thereon, magnetism generating portions 9 of the electromagnet 8 must be adjacent to the ion deflection pathway 5 for generation of the uniform magnetic field lines G so as to form a stable and strong magnetic field for bending of the ion beam 4; therefore, magnitude X of the ion beam 4 in FIG. 2 in the direction of curvature radius may be increased to some extent by increasing in size the electromagnet 8 while widthwise magnitude Y shown vertically in FIG. 2 cannot be increased. More specifically, increasing the widthwise magnitude Y would require spacing between the magnetism generating portions 9 to be increased as shown in FIG. 3; such increased spacing between the magnetism generating portions 9 would lead to failure of forming an uniform magnetic field in the ion deflection pathway 5 due to deformation of the magnetic field lines G outside, resulting in nonuniform bent of the ions and failure of obtaining a stable ion beam 4. Thus, there have been no ion beam 4 larger in size and uniformly ion mass separated since increase of the widthwise magnitude Y is unavailable.

The present invention is made to solve such problems in the conventional apparatuses and has its object to provide an ion mass separation process, an ion mass separator and an ion doping apparatus, enabling uniform ion mass separation in an ion beam larger in size.

SUMMARY OF THE INVENTION

Arranged outside of an ion deflection casing with a curved contour and having an inlet and an outlet is a hollow exciting current pathway in the form of conductor means which is composed of a widthwise spiral formation running through the inlet and outlet and along the curved contour; an ion beam introduced between the conductors at the inlet is bent in the ion deflection casing for ion mass separation so that a magnetic field which is uniform widthwise can be formed even if the ion deflection casing is of a shape broader in width. As a result, the ion beam broader in width can be bent uniformly widthwise, resulting in obtaining the high-quality ion beam which is broader in width and uniformly ion mass separated.

Moreover, ion doping can be effected by such high-quality ion beam uniformly ion mass separated and having no extra ion species so that implantation depth distribution of ions can be made uniform and extra thermal load is prevented from being imparted to a substrate. The ion beam broader in width enables ion doping to be effected over an extensive area of a substrate in a single operation, thereby substantially improving operation efficiency.

BEST MODE FOR CARRYING OUT THE INVENTION

Preferred embodiments of the invention will be described in conjunction with drawings.

Figure 4:
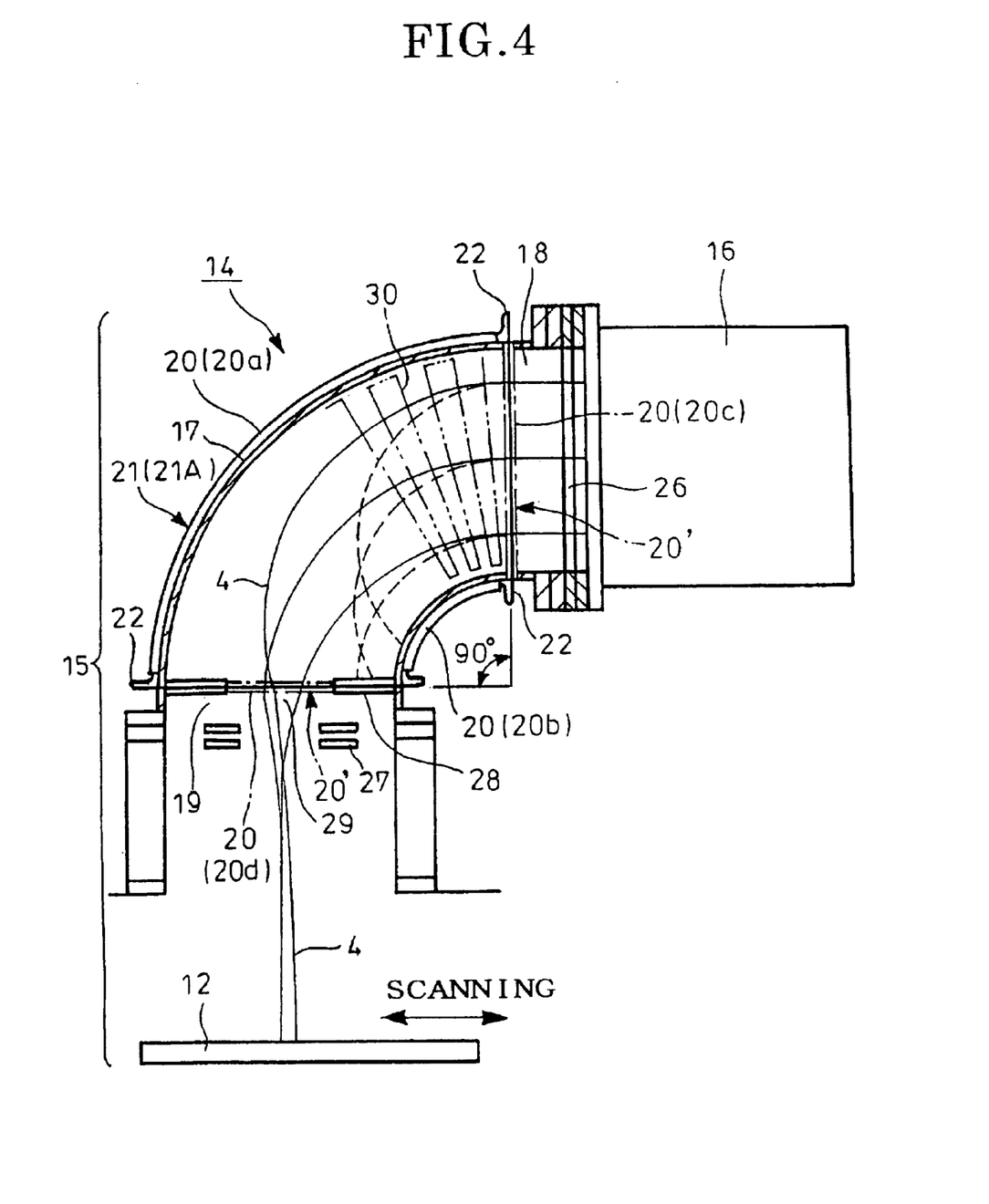
FIG. 4 is a sectional side view showing an embodiment of an ion mass separator and ion doping apparatus according to the invention.

FIG. 4 is a schematic view showing an ion mass separator 14 and an ion doping apparatus 15 using the same according to the invention in which reference numeral 16 denotes an ion generator with a plasma generating portion; and 17, an ion deflection casing.

The ion deflection casing 17 shown in FIG. 4 has a substantially fan-shaped side contour to provide a broader space which is long in a direction perpendicular to plane of the drawing. The substantially fan-shaped contour has linear end portions which provide an inlet 18 and an outlet 19, the inlet 18 being connected to the ion generator 16. The inlet 18 and the outlet 19 are angularly displaced with each other by, for example, 90° for deflection of the ion beam 4 with the greater angle.

Figure 5:
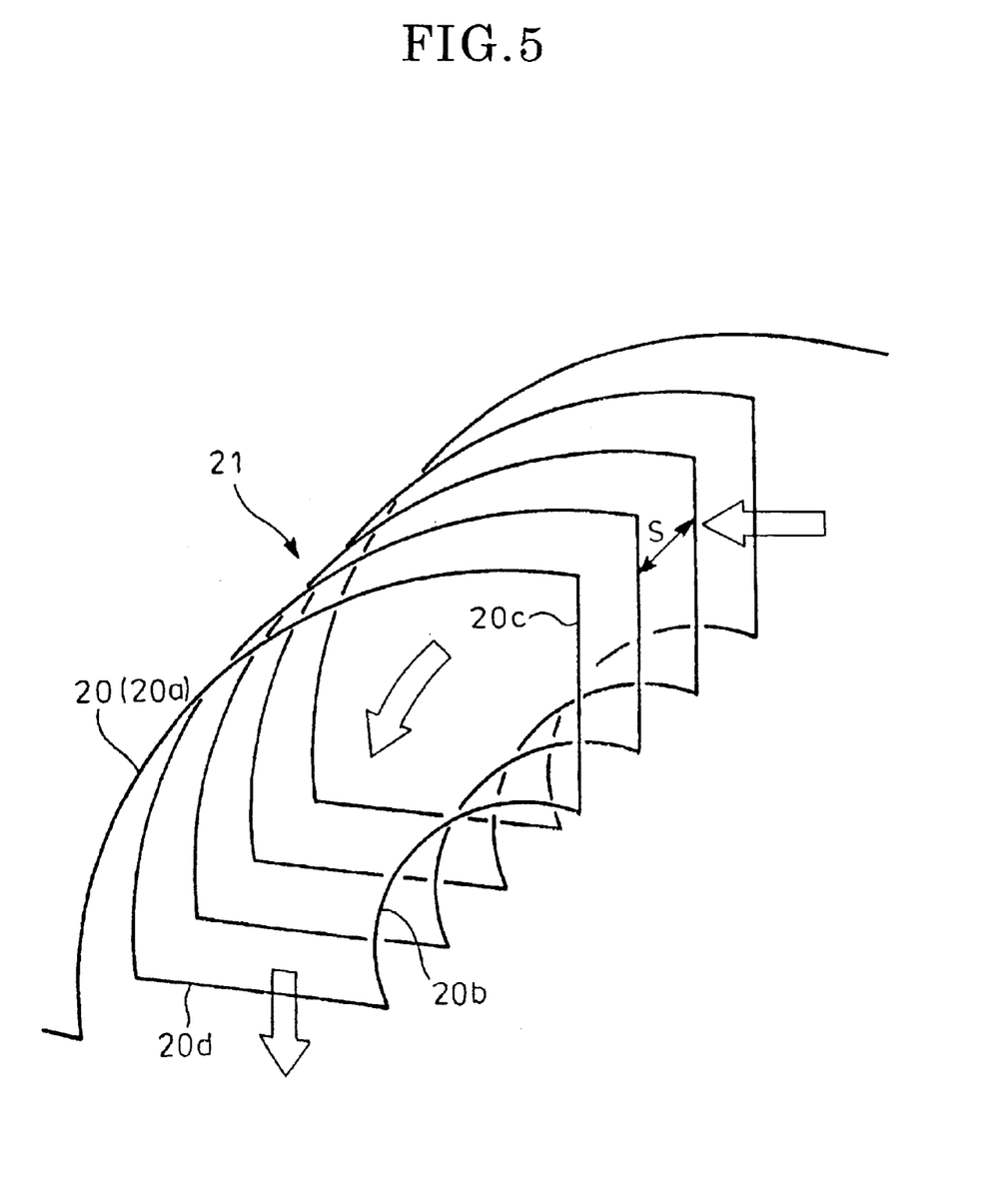
FIG. 5 is a perspective view showing a spiral formation of conductor means.

Conductor means 20 is arranged outside of the ion deflection casing 17 and is composed of a spiral formation of components mutually spaced apart widthwise at predetermined intervals, the spiral formation running through the inlet 18 and the outlet 19 and along the curved contour as shown in FIGS. 4 and 5, thereby providing a hollow exciting current pathway 21 which is broader in the direction perpendicular to the plane of the drawing. Thus, the hollow exciting current pathway 21 shown in FIG. 4 provides a fan-shaped current pathway 21A.

In the fan-shaped current pathway 21A shown in FIG. 4, the spiral formation is provided by sequentially interconnecting, via connectors 22, outer arcuate conductors 20a arranged at required intervals and outside of a larger-radius side portion of the ion deflection casing 17, inner arcuate conductors 20b arranged at required intervals and outside of a smaller-radius side portion of the ion deflection casing 17, and linear conductors 20c and 20d arranged at required intervals for formation of linear portions 20' in the inlet 18 and the outlet 19.

Figure 6:
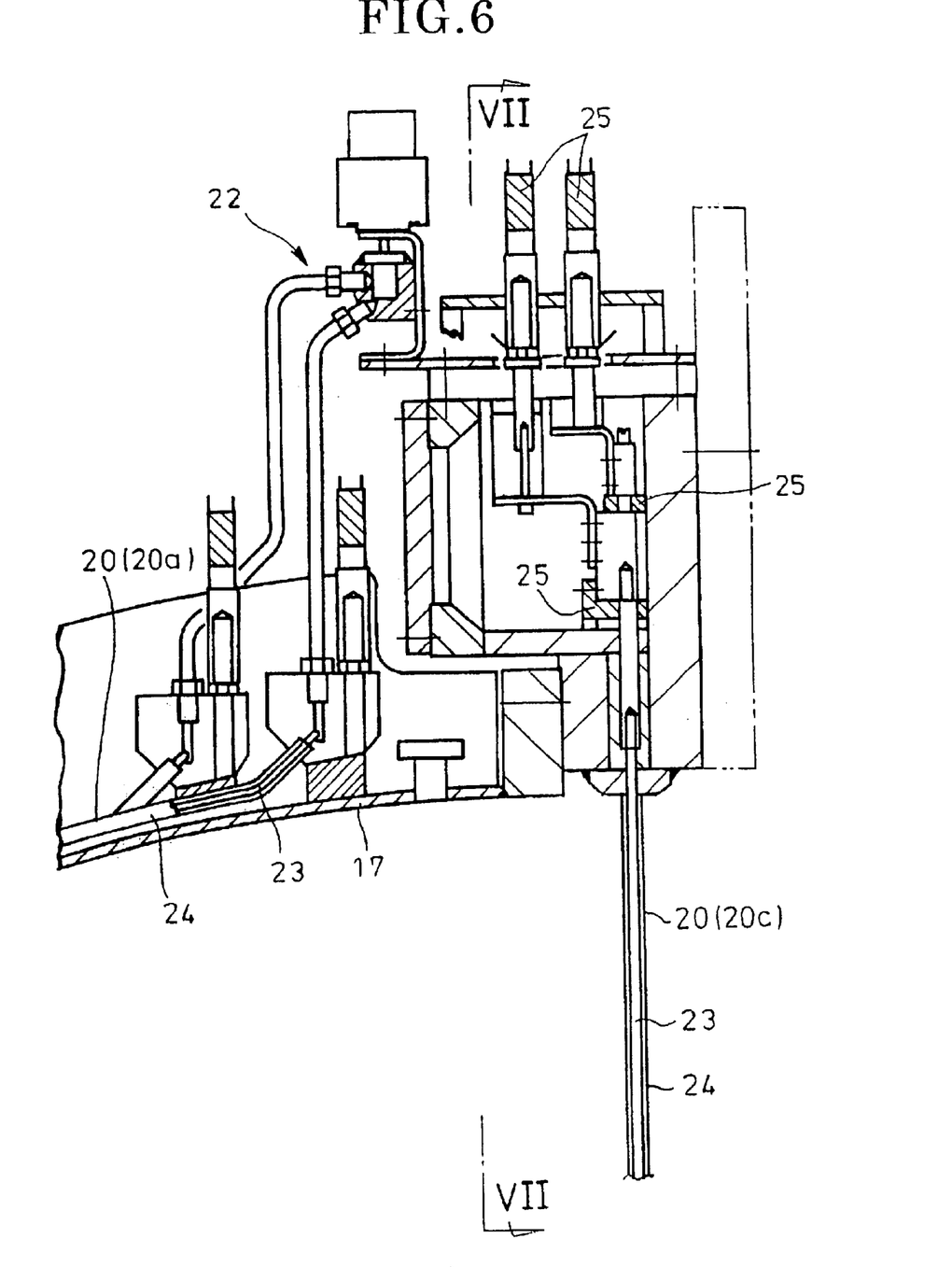
FIG. 6 is a partial detailed view of an inlet shown in FIG. 4.
Figure 7:
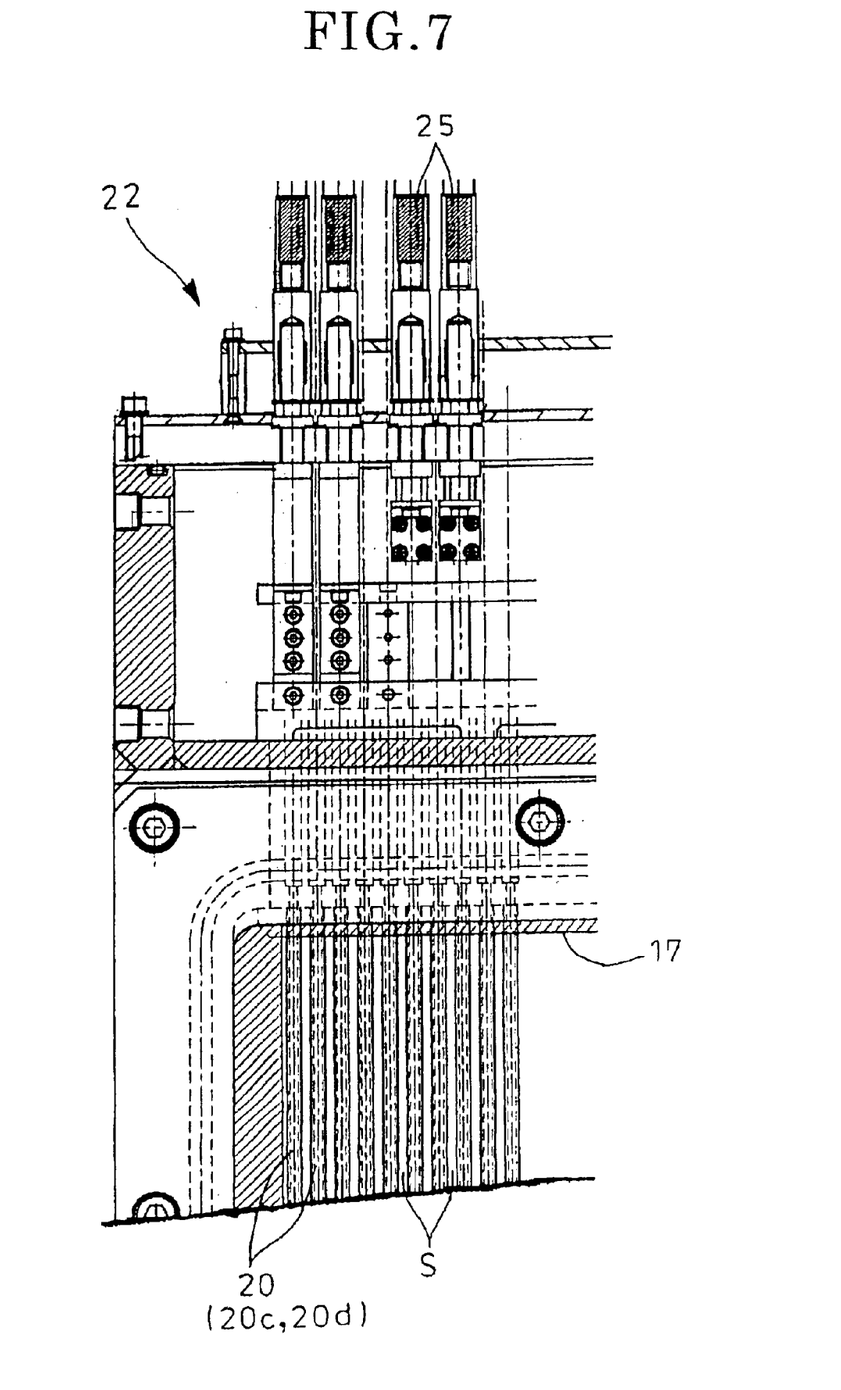
FIG. 7 is a view looking in the direction of arrows VII in FIG. 6.

As detailedly shown in FIGS. 6 and 7, each conductor of the conductor means 20 is in the form of rod and comprises a conductive core 23 and an outer conductor portion 24 for surrounding the conductive core 23, deionized water being supplied between the conductive core 23 and the outer conductor portion 24. Isolation material 25 at the connectors 22 provides isolation between the conductive core 23 and outer conductor portion 24 while the respective outer conductor portions 24 are electrically interconnected to thereby shield electric potential of the hollow exciting current pathway 21.

As shown in FIG. 7, required spacing S is provided between each of the linear conductors 20c and 20d at the inlet 18 and outlet 19; ions from the ion generator 16 are introduced into and out of the ion deflection casing 17 through such spacings S.

As shown in FIG. 4, arranged between the linear conductors 20c in the inlet 18 and the ion generator 16 are rod-like ion extraction electrodes 26 so as to be positioned in a relationship spaced apart from each other and overlapped with the linear conductors 20c.

Arranged adjacent to the outlet 19 are ion acceleration electrodes 27. Each of the linear conductors 20d in the outlet 19 shown in FIG. 4 is provided at its opposite sides (left and right in the figure) with shielding members 28 which partly block off interspaces between the linear conductors 20d to leave an ion extraction port 29.

The ion deflection casing 17, which constitutes the fan-shaped current pathway 21A, has widthwise opposite inner ends along each of which extends a neutralizing electronic supply 30 in the form of, for example, filament for neutralizing space charge of the ion beam 4.

The above-mentioned ion mass separator 14 may be employed in an ion doping apparatus 15 where operations such as convergence of the ion beam 4, which is mass separated in the ion mass separator 14, may be effected as needs demand and then irradiation to a substrate 12 to be dealt with is effected to implant the ions into the substrate 12.

Next, the mode of operation of the above embodiment will be described.

In the ion mass separator 14 shown in FIG. 4, ions generated in the plasma generating portion in the ion generator 16 are extracted and accelerated by the ion extraction electrodes 26 at the inlet 18, introduced, while accelerated by the linear conductors 20c, through the spacings S between the linear conductors 20c into the ion deflection casing 17 of the fan-shaped current pathway 21A and undergo bending by the action of the hollow exciting current pathway 21. The ion beam 4 thus bent is extracted and accelerated by the ion acceleration electrodes 27 at the outlet 19 to be taken out outside. It is also accelerated by the linear conductions 20d at the outlet 19.

As shown in FIG. 4, the hollow exciting current pathway 21 is arranged outside of the ion deflection casing 17 and is constituted by a widthwise spiral formation (FIG. 5) of conductor means 20 running through the inlet 18 and outlet 19 and along the curved contour, which leads to forming a magnetic field within the ion deflection casing 17 which has magnetic field lines extending widthwise and perpendicular to the plane of the drawing of FIG. 4. As a result, this magnetic field has strength which is uniform widthwise of the fan-shaped current pathway 21A. In this connection, the outer conductor portions 24 surrounding the conductive cores 23 in the conductor means 20 are electrically interconnected to shield electric potential of the fan-shaped current pathway 21A so that any voltage potential difference in the fan-shaped current pathway 21A exerts no influence on beam trajectory.

Thus formed magnetic field in the fan-shaped current pathway 21A, which is uniform widthwise, causes ions in the ion beam 4 to receive bending force in accordance with mass thereof and uniform widthwise of the fan-shaped current pathway 21A and to be bent uniform. As shown in dot lines in FIG. 4, ions with mass less than that desired are bent earlier, collide with a smaller-radius side inner peripheral portion of the ion deflection casing 17 and are neutralized by the neutralizing electronic supplies 30; ions with mass greater than that desired fail to be fully bent, collide with a larger-radius side inner peripheral portion of the ion deflection casing 17 and are neutralized by the neutralizing electronic supplies 30.

As a result, only ions with desired mass shown by solid lines are led to the outlet 19 at the other end of the ion deflection casing 17. Since the ion extraction port 29 is provided by the linear conductors 20d at the outlet 19 partly having the shielding members 28, desired ions can be further accurately separated for take-out by selecting a size and a position of the ion extraction port 29 and selecting strength of the magnetic field of the conductor means 20.

Thus, according to the above-mentioned ion mass separator 14, the high-quality ion beam 4 which is larger in size and particularly broader in width and is uniformly ion mass separated can be taken out.

In an ion doping apparatus 15 using the ion mass separator 14, an ion beam 4 generated in the ion mass separator 14 may undergo operations such as convergence as need demands, and then is irradiated with scanning onto a substrate 12 to be dealt with so as to implant the ions to the substrate 12. Because of the ion beam 4 being composed only by desired ions including no extra ion species, implantation depth distribution of ions can be made uniform upon ion doping and extra thermal load is prevented from being imparted to the substrate 12. The ion beam 4 broader in width enables ion doping to be effected over an extensive area of a substrate 12 in a single operation, thereby substantially improving operation efficiency.

The sectional shape of the hollow exciting current pathway 21 is not limited to be substantially fan-shaped as shown in FIG. 4 and may be various; preferably, it is at least of a shape which allows deflection with a greater angle (for example, 90°). The components of the conductor means 20 arranged at the inlet 18 and outlet 19 preferably provides linear portions 20'.

Figure 8:
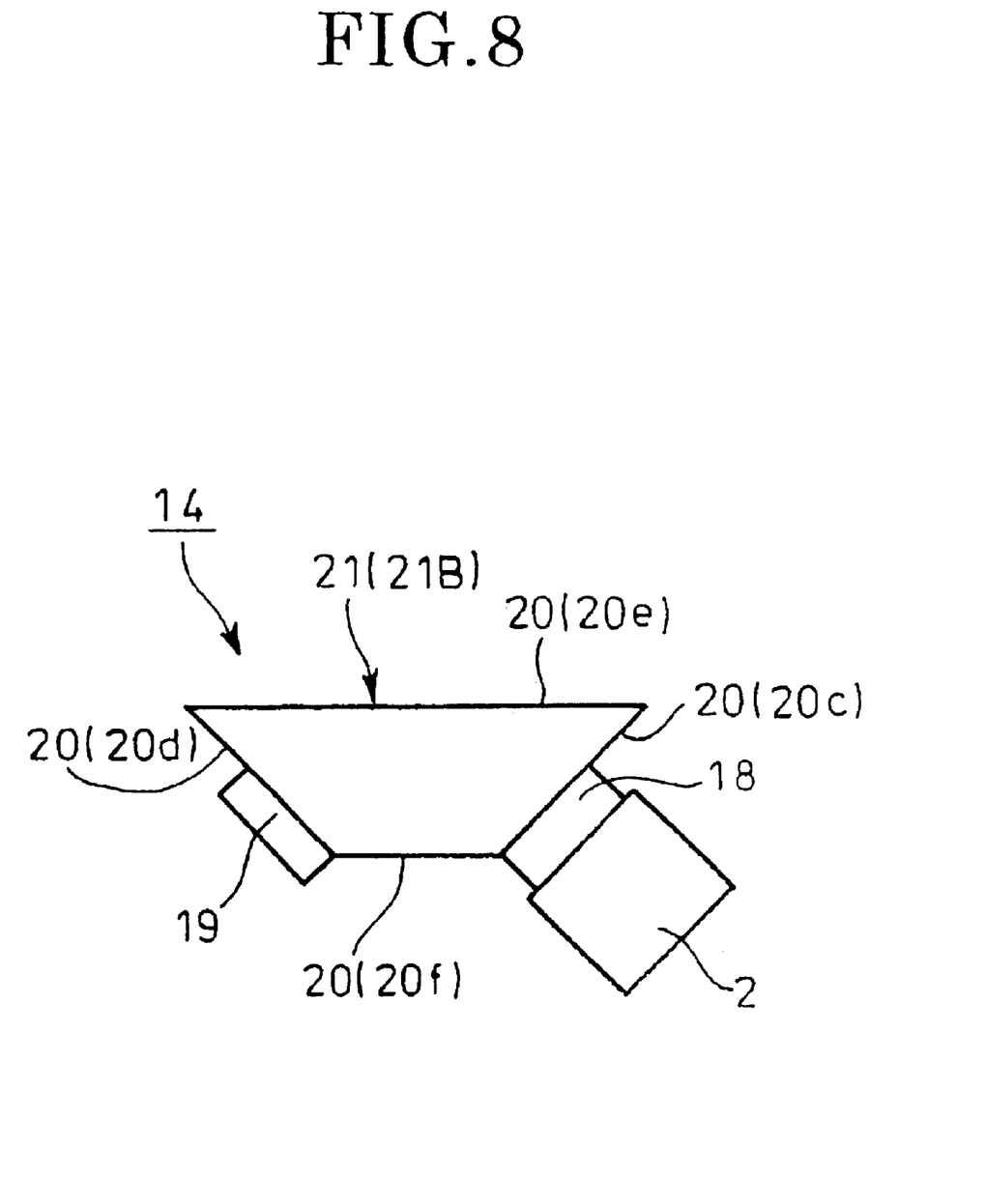
FIG. 8 is a schematic diagram showing an embodiment of a trapezoidal current pathway.

FIG. 8 shows an embodiment wherein the hollow exciting current pathway 21 is a trapezoidal current pathway 21B which has longer- and shorter-side conductors 20e and 20f which in turn are interconnected at their ends by linear conductors 20c and 20d at the inlet 18 and outlet 19. Such a structure also has functions similar to those of the fan-shaped current pathway 21A shown in FIG. 4.

Industrial Applicability

An ion beam larger in size can be uniformly mass separated so that upon ion doping implantation depth distribution of ions can be made uniform and extra thermal load is prevented from being imparted to a substrate. The ion beam broader in size enables ion doping to be effected over an extensive area of a substrate in a single operation, thereby substantially improving operation efficiency.

What is claimed is:

1. An ion mass separation process comprising:
   arranging a hollow exciting current pathway in a form of a conductor outside of an ion deflection casing with a curved contour and having an inlet and an outlet, said conductor is composed of a widthwise spiral formation of conductors running through the inlet and outlet and along the curved contour, thereby forming a magnetic field in the ion deflection casing which is uniform widthwise,
   introducing an ion beam through between the conductors at the inlet into the ion deflection casing so as to be bent therein depending upon mass of ions by action of the magnetic field through the hollow exciting current pathway; and
   taking out the ion beam with desired mass through between the conductors at the outlet.

2. An ion mass separator comprising:
   a hollow exciting current pathway in a form of a conductor arranged outside of an ion deflection casing with a curved contour and with an inlet and an outlet,
   wherein said conductor is composed of a widthwise spiral formation of conductors running through the inlet and outlet and along the curved contour, ion extraction electrodes arranged adjacent to the inlet, an ion generator adjacent to the ion extraction electrodes, and ion acceleration electrodes arranged adjacent to the outlet.

3. An ion doping apparatus comprising an ion mass separator according to claim 2 by which an ion beam is mass separated to be irradiated to a substrate for ion implantation.

4. An ion mass separator according to claim 2, wherein each of the conductors comprises a conductive core and an outer conductor portion surrounding said conductive core, the respective outer conductor portions being electrically interconnected to shield electric potential of the hollow exciting current pathway.

5. An ion doping apparatus comprising an ion mass separator according to claim 4 by which an ion beam is mass separated to be irradiated to a substrate for ion implantation.

6. An ion mass separator according to claim 2, wherein the conductors at the inlet and outlet provide linear portions.

7. An ion doping apparatus comprising an ion mass separator according to claim 6 by which an ion beam is mass separated to be irradiated to a substrate for ion implantation.

8. An ion mass separator according to claim 2, wherein the hollow exciting current pathway is a fan-shaped current pathway that includes outer and inner arcuate conductors and linear conductors arranged at the inlet and outlet for connecting ends of the arcuate conductors.

9. An ion doping apparatus comprising an ion mass separator according to claim 8 by which an ion beam is mass separated to be irradiated to a substrate for ion implantation.

10. An ion mass separator according to claim 2, wherein the hollow exciting current pathway is a trapezoidal current pathway that includes longer-side and shorter-side conductors and linear conductors arranged at the inlet and outlet for connecting ends of the longer-side and shorter-side conductors.

11. An ion doping apparatus comprising an ion mass separator according to claim 10 by which an ion beam is mass separated to be irradiated to a substrate for ion implantation.

12. An ion mass separator according to claim 2, wherein the conductors at the outlet are partially shielded by shielding members to leave an ion take-out port.

* * * * *